(12) United States Patent
Li et al.

(10) Patent No.: US 12,363,915 B2
(45) Date of Patent: Jul. 15, 2025

(54) ON-PITCH VIAS FOR SEMICONDUCTOR DEVICES AND ASSOCIATED DEVICES AND SYSTEMS

(71) Applicant: Micron Technology, Inc., Boise, ID (US)

(72) Inventors: Hongqi Li, Boise, ID (US); James A. Cultra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 233 days.

(21) Appl. No.: 17/929,234

(22) Filed: Sep. 1, 2022

(65) Prior Publication Data

US 2023/0005991 A1    Jan. 5, 2023

Related U.S. Application Data

(63) Continuation of application No. 16/983,843, filed on Aug. 3, 2020, now Pat. No. 11,437,435.

(51) Int. Cl.
*H10B 63/00* (2023.01)
*G11C 13/00* (2006.01)
(Continued)

(52) U.S. Cl.
CPC ......... *H10B 63/80* (2023.02); *G11C 13/0002* (2013.01); *H01L 23/5384* (2013.01);
(Continued)

(58) Field of Classification Search
CPC ............. H01L 23/5226; H01L 23/5283; H01L 23/528; H01L 27/092; H10B 63/80; H10N 70/841; H10N 70/881
See application file for complete search history.

(56) References Cited

U.S. PATENT DOCUMENTS 10,096,612 B2    10/2018    Vegunta et al.
11,227,648 B2*    1/2022    Bedeschi ............ G11C 11/2259
(Continued)

FOREIGN PATENT DOCUMENTS

CN    110462740 A    11/2019
TW    201507006 A    2/2015

OTHER PUBLICATIONS

Taiwanese Office Action, Application No. 110128377 dated Jun. 16, 2020, 7 pages with English translation.
(Continued)

*Primary Examiner* — Zandra V Smith
*Assistant Examiner* — John M Parker
(74) *Attorney, Agent, or Firm* — Dorsey & Whitney LLP

(57) ABSTRACT

Semiconductor devices with on-pitch vias, and associated systems and methods, are disclosed herein. In one embodiment, the semiconductor device may include a 3-dimensional (3D) cross-point memory array. The semiconductor device also includes access lines for the memory array, which couple with on-pitch vias connected to CMOS circuitry disposed underneath the memory array. In some embodiments, a first access line may be coupled with a first via outside a boundary of the memory array, where the first via is separated from the boundary by a first distance and has a first length longitudinal to the first access line. Further, a second access line may be coupled with a second via outside the boundary, where the second via is separated from the boundary by a second distance greater than the first distance and has a second length longitudinal to the second access line, the second length different from the first length.

13 Claims, 7 Drawing Sheets

(51) Int. Cl.
  *H01L 23/538* (2006.01)
  *H10D 84/85* (2025.01)
  *H10N 70/00* (2023.01)

(52) U.S. Cl.
  CPC ........... *H10D 84/85* (2025.01); *H10N 70/841* (2023.02); *H10N 70/881* (2023.02)

(56) References Cited

U.S. PATENT DOCUMENTS

| | | | |
|---|---|---|---|
| 2014/0042627 A1* | 2/2014 | Edelstein | G09C 1/00 257/E21.59 |
| 2014/0284676 A1 | 9/2014 | Inaba et al. | |
| 2016/0351573 A1 | 12/2016 | Yoshino et al. | |
| 2017/0059650 A1* | 3/2017 | Tipple | G01R 31/2884 |
| 2017/0358595 A1 | 12/2017 | Freeman et al. | |
| 2019/0164889 A1* | 5/2019 | Biswas | H01L 23/5283 |
| 2019/0312051 A1 | 10/2019 | Park et al. | |
| 2020/0243440 A1 | 7/2020 | Li et al. | |
| 2020/0350225 A1 | 11/2020 | Economy et al. | |
| 2020/0402988 A1 | 12/2020 | Howder et al. | |
| 2021/0225937 A1 | 7/2021 | Economy et al. | |
| 2021/0305506 A1 | 9/2021 | Albini | |

OTHER PUBLICATIONS

Office Action mailed Nov. 2, 2022 for Chinese Patent Application No. 202110887058.2, 9 pages (with translation).

* cited by examiner

500

```
┌─────────────────────────────────────────────┐
│ Partially form a plurality of memory cells  │
│ in an array region of the memory device,    │
│ the array region including a border         │
│ separating the array region from a          │─ 510
│ peripheral region, where each of the        │
│ memory cells includes a first conductive    │
│ material                                    │
└─────────────────────────────────────────────┘
                      │
                      ▼
┌─────────────────────────────────────────────┐
│ Form a first via and a second via in an     │
│ insulative material of the peripheral       │
│ region, where the first via is separated    │
│ from the border by a first distance and has │
│ a first length perpendicular to the border, │─ 515
│ and where the second via is separated from  │
│ the border by a second distance greater     │
│ than the first distance and has a second    │
│ length perpendicular to the border, the     │
│ second length less than the first length    │
└─────────────────────────────────────────────┘
```

*Figure 5*

ON-PITCH VIAS FOR SEMICONDUCTOR DEVICES AND ASSOCIATED DEVICES AND SYSTEMS

CROSS REFERENCE TO RELATED APPLICATION

This application is a continuation of U.S. patent application Ser. No. 16/983,843, filed Aug. 3, 2020, which is incorporated by reference herein in its entirety.

TECHNICAL FIELD

The present technology generally relates to memory devices and methods for manufacturing memory devices, and more particularly relates to on-pitch vias for semiconductor devices.

BACKGROUND

Memory devices are widely used to store information related to various electronic devices such as computers, wireless communication devices, cameras, digital displays, and the like. Information is stored by programing different states of a memory cell. Various types of memory devices exist, such as non-volatile memory devices (e.g., NAND Flash memory devices) and volatile memory devices (e.g., dynamic RAM (DRAM), synchronous dynamic RAM (SDRAM), etc.).

Improving memory devices, generally, may include increasing memory cell density, increasing read/write speeds or otherwise reducing operational latency, increasing reliability, increasing data retention, reducing power consumption, or reducing manufacturing costs, among other metrics. One way of reducing manufacturing costs is to improve manufacturing processes to increase the margin of successfully manufactured devices. Manufacturers can improve the manufacturing margin by implementing processes that, for example, increase the consistency or tolerance off manufacturing steps (e.g., removal or deposition of materials), improve the scale of manufacturing, reduce variability among memory cells, etc.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIG. 5 is a flowchart of a method for making a memory device including on-pitch vias in accordance with embodiments of the present technology.

DETAILED DESCRIPTION

Figure 1:
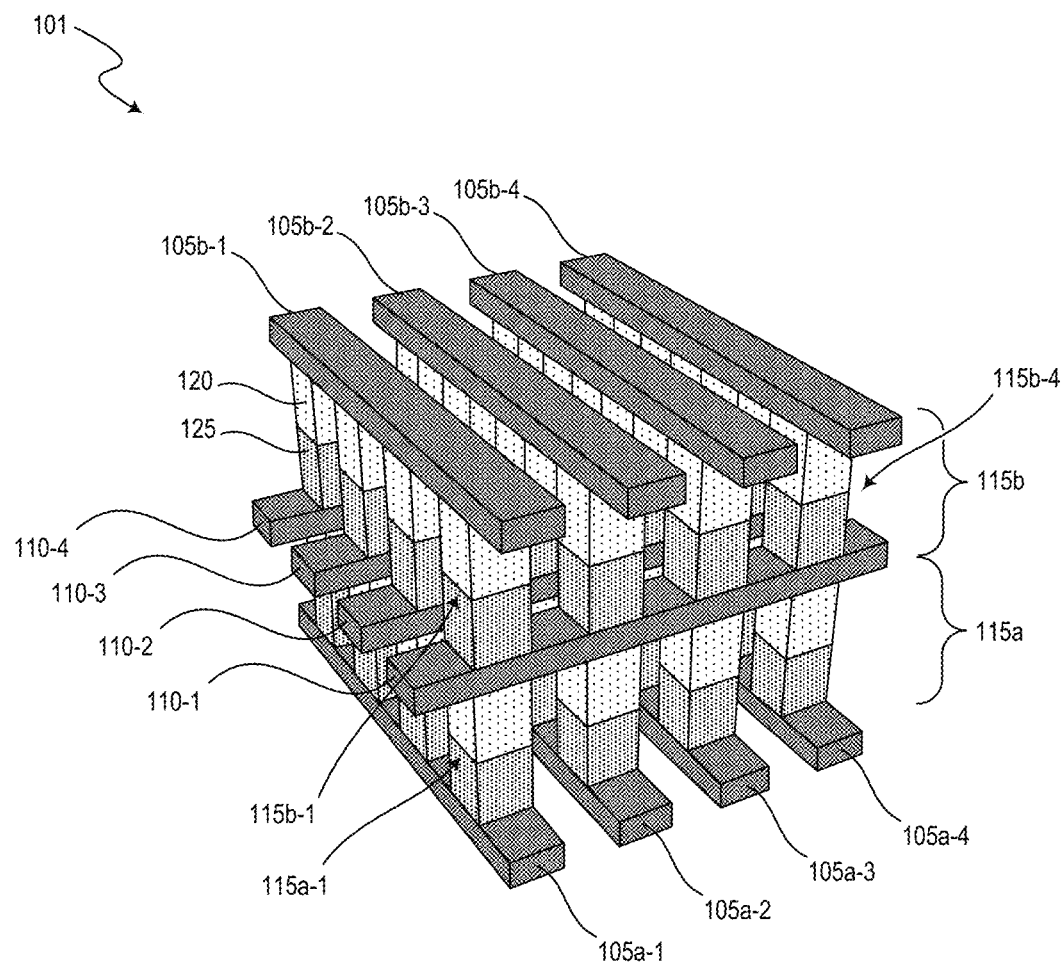
FIG. 1 is a schematic diagram of a 3-dimensional cross-point memory array in accordance with embodiments of the present technology.

Embodiments of the present technology include on-pitch vias that connect access lines of a memory array to complementary metal-oxide-semiconductor (CMOS) circuitry. In some embodiments, the memory array may include densely populated access lines (e.g., word lines, bit lines) that topologically cross each other without physical intersections. Further, memory cells can be formed at each topological cross-points between individual word lines and bit lines. In this manner, individual access lines may be coupled with a plurality of memory cells. Such access lines may be formed with a minimum pitch (e.g., a combination of a minimum line width and a minimum space between the lines in a repeated line and space pattern) for a given process technology node to maximize a quantity of memory cells per unit area.

In some embodiments, a substrate includes the CMOS circuitry configured to access (e.g., read, write) the memory cells coupled with access lines, above which the memory array is disposed. In such embodiments, individual access lines laterally extend across a boundary of the memory array and connect to corresponding vias that vertically extend from the CMOS circuitry. Such vias may have a dimension (e.g., width) equal to (or less than) the pitch of the access lines—hence, the vias may be referred to as on-pitch vias. The interface between the on-pitch vias and the corresponding access lines may determine an amount of current flowing between the memory cells and the CMOS circuitry through the access lines (e.g., the access lines carrying the current). Maintaining the current uniform throughout the memory array may be beneficial to minimize variations in electrical characteristics of the memory cells, such as programming and/or read current distributions, cycling behaviors, data retention characteristics, among others.

In some embodiments, a group of on-pitch vias may be disposed in an area next to the memory array, which may be referred to as a socket area (or a socket region). During fabrication processing steps, the socket area may experience nonuniform processing conditions due to differences between the memory array and the socket area—e.g., differences in pattern density, material compositions, or the like. Such nonuniform processing conditions may result in the vias in the socket region to have unintended, dissimilar features from each other. For example, the vias designed to have identical physical dimensions (e.g., vias laid out identical to each other) may have different heights depending on their proximity to the memory array. In other examples, the vias disposed proximate to the memory array may develop uneven surface topology and/or interface characteristics, which may interfere with the current flowing past the surface and/or the interface. Such variabilities may be referred to as a proximity effect. If the proximity effect influences the on-pitch vias resulting in undesirably broad distributions of the current flowing through the on-pitch vias, the memory arrays may suffer from reduced yield and/or become susceptible to reliability issues.

The present technology facilitates to reduce nonuniformities in electrical characteristics of the on-pitch vias that may be incurred by the process variabilities stemming from the proximity effect to the memory array. In some embodiments, lengths of on-pitch vias (in some cases, with their widths fixed at a constant value, e.g., equal to or less than the pitch of access lines) may be modified based on distances between the on-pitch vias and the memory array. For example, the on-pitch vias located nearer to the memory array may be designed (e.g., laid out) to include a greater length than other on-pitch vias located farther from the memory array. As a result, the on-pitch vias located nearer to the memory array may have more elongated surface shape having a greater surface area than the other on-pitch vias. In some cases, the greater surface area of the on-pitch vias may improve surface and/or interface characteristics of the vias to be more robust against nonuniform process conditions—e.g., a nonuniform process conditions associated with a chemical-mechanical polishing process that exposes the surface of on-pitch vias.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1 through 5. For example, some details of memory devices well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1 through 5.

FIG. 1 is a schematic diagram of a 3-dimensional (3D) cross-point memory array 101. The memory array 101 illustrates two (2) decks of memory arrays—e.g., a first deck (a lower deck) including memory cells 115a, a second deck (an upper deck) including memory cells 115b. Each deck includes two sets of access lines (e.g., word lines, bit lines). Namely, the memory array 101 includes the first deck having a set of word lines 105a (individually identified as 105a-1 through 105-a4) and a set of bit lines 110 (individually identified as 110-1 through 110-4), the second deck including a set of word lines 105b (individually identified as 105b-1 through 105-b4) and the set of bit lines 110. As shown in FIG. 1, the set of bit lines 110 are common to (shared by) both the first and second decks of the memory array 101. At each topological cross-point of individual word lines 105a (or word lines 105b) and bit lines 110, a memory cell 115a (or a memory cell 115b) may be formed. Moreover, as one skilled in the art will readily appreciate, the word lines and the bit lines are interchangeable (and can be collectively referred to as access lines) without losing their functions and/or meanings.

As depicted in FIG. 1, the word lines 105 are substantially parallel each other. Similarly, the bit lines 110 are substantially parallel to each other. Further, the set of word lines may extend to a first direction and the set of bit line may extend to a second direction that is substantially perpendicular to the first direction. In some cases, the word lines may be referred to as rows. Similarly, the bit lines may be referred to as columns. In some embodiments, the access lines include a conductive material (e.g., tungsten (W), copper (Cu)).

Each memory cell 115 may include a storage component 120 and a selector component 125 connected in series. In some embodiments, the memory component 120 and/or the selector component 125 include chalcogenide materials. In some embodiments, the storage component 120 includes a conductive material that interfaces with the access lines. For example, as depicted in FIG. 1, the storage component 120 of the memory cell 115b connects to the access line 105b through the conductive material (not shown). Similarly, the selector component 125 may include a conductive material that interfaces with the access lines. For example, as depicted in FIG. 1, the selector component 125 of the memory cell 115b connects to the access line 110 through the conductive material (not shown). In some cases (not shown), each memory cell may comprise a sole component, for example comprising a chalcogenide material, acting both as storage and selector components. The sole component may be referred to as a self-selecting component.

In some cases, the composite stack of materials forming the memory cells may be collectively referred to as cell stacks. For example, a cell stack depicted in FIG. 1 may include a word line 105a-1 (e.g., a conductive material of the word line 105a-1), a memory cell 115a-1, a bit line 110-1 (e.g., a conductive material of the bit line 110-1), a memory cell 115b-1, and a word line 105b-1. In some cases, when the fabrication process for making the memory array 101 is in progress, the cell stack may omit one or more materials. For example, when the word line 105b-1 is not yet formed, the cell stack may refer to the stack including the word line 105a-1, a memory cell 115a-1, a bit line 110-1, and a memory cell 115b-1.

In operation, a memory device including the memory array 101 may select (or activate) a word line and a bit line of a deck using CMOS circuitry through vias (e.g., on-pitch vias) coupled with the word line and the bit line, respectively. For example, the word line 105a-1 and the bit line 110-1 can be selected (e.g., activated) by the CMOS circuitry to access (e.g., read, write) the memory cell 115a-1 to determine (or modify) a logic state of the memory cell 115a-1. Similarly, the word line 105b-4 and the bit line 110-1 can be selected (e.g., activated) by the CMOS circuitry to access (e.g., read, write) the memory cell 115b-4. Although, in the foregoing example embodiment, the memory array having two (2) decks of memory cells has been described and illustrated, in other embodiments, memory arrays may include a different quantity of decks of memory cells. For example, memory arrays may include four (4), eight (8), or even more decks of memory cells. Further, although each memory cell 115 has been described to have a storage component disposed above a selector component, the present technology is not limited thereto. For example, each memory cell 115 may include a selector component disposed above a storage component, or a sole chalcogenide-based self-selecting component that may act both for storage and selection.

Figure 2:
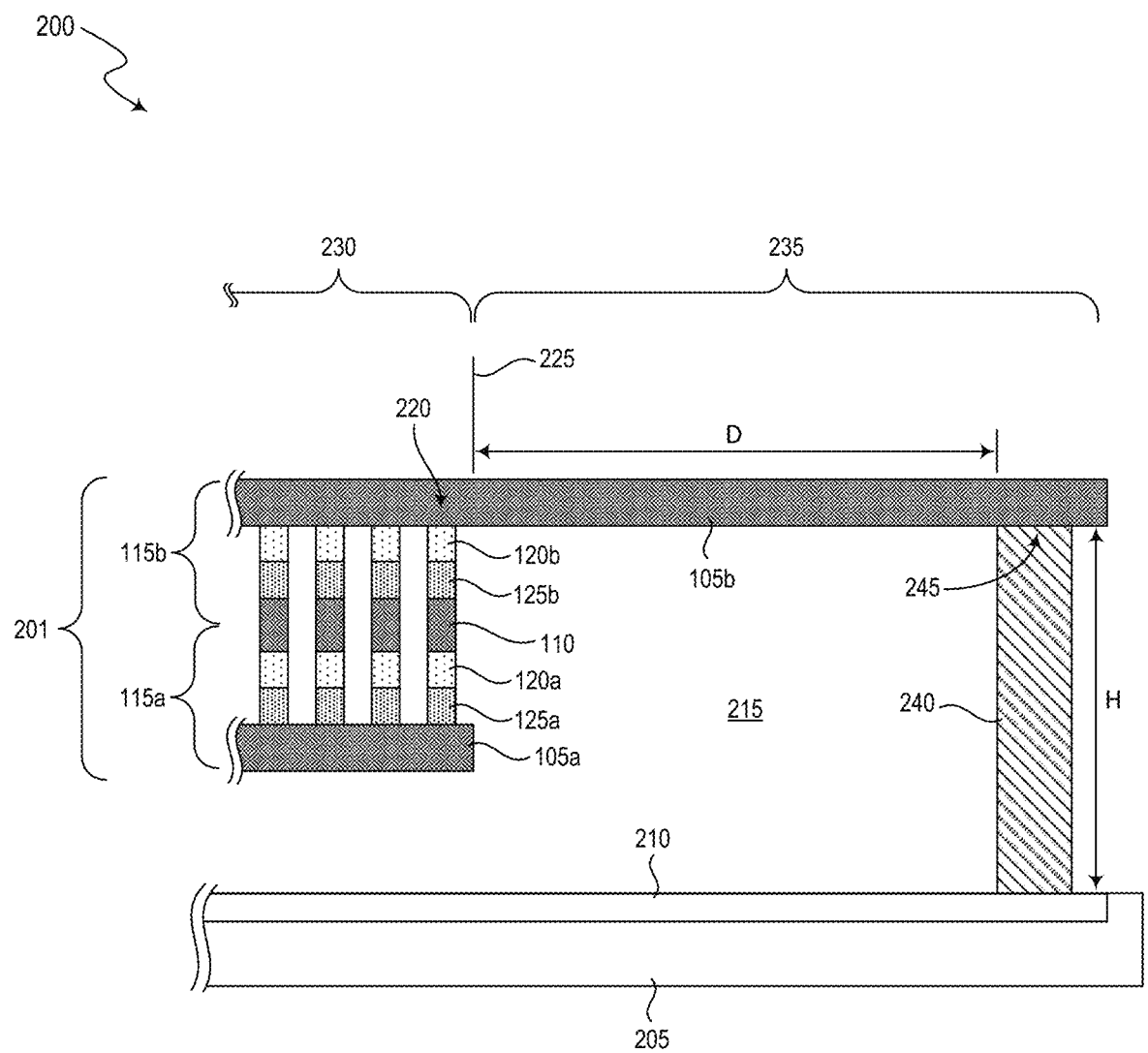
FIG. 2 is a cross-sectional schematic diagram illustrating a 3-dimensional cross-point memory array and an on-pitch via in accordance with embodiments of the present technology.

FIG. 2 is a cross-sectional schematic diagram 200 illustrating a 3D cross-point memory array 201 and a via (e.g., an on-pitch via) in accordance with embodiments of the present technology. The diagram 200 may illustrate a portion of a 3D cross-point memory device. The memory array 201 may be an example of or include aspects of the memory array 101. For example, the memory array 201 includes word lines 105, bit lines 110, and memory cells 115 with storage components 120 and selector components 125, or self-selecting components acting both as selector and storage components. In this regard, the memory array 201 as depicted in the diagram 200 may correspond to a cross-section of the memory array 101 cutting along a set of the word lines of both decks (e.g., a word line 105a-1 and a word line 105b-1). The diagram 200 includes a substrate 205 having CMOS circuitry 210, above which the memory array 201 is disposed. Moreover, the diagram 200 includes an on-pitch via 240 connected to and extending from the CMOS circuitry 210 toward the word line 105b. The diagram 200 also depicts an insulative material 215. In some embodiments, the insulative material 215 may be a composite material including two or more dissimilar insulative materials (e.g., oxides, nitrides, oxynitrides) formed by various processing steps.

The on-pitch via 240 connects to the word line 105b that extends across a boundary 225 of the memory array 201. In some cases, the boundary 225 may correspond to a position where other access lines terminate—e.g., the position where the word line 105a terminates, as depicted in the diagram 200. In other cases, the boundary 225 may correspond to a position where the last cell stack of the memory array 201 is located—e.g., the position where the cell stack 220 is located. As such, the boundary 225 may be regarded as a border between an array region 230 and a socket region 235 (which may be referred to as a peripheral region). In this regard, the socket region 235 is disposed adjacent to a side (e.g., the boundary 225) of the array region 230. A distance between the on-pitch via 240 and the boundary 225 is denoted as "D" in FIG. 2. Also, a height of the on-pitch via 240 is denoted as "H" in FIG. 2, which may be regarded as a desired height of the on-pitch via 240 as the word line 105b does not experience any undulation (either up and/or down, or otherwise bent upward and/or downward) extending across the boundary 225 and connecting to the on-pitch via 240. Such an undulation may degrade the electrical characteristics of an interface 245 between the on-pitch via 240 and the word line 105b, which may reduce the amount of current flowing therethrough. The height H of the on-pitch via 240 may generally correspond to a vertical distance between the CMOS circuitry 210 and the word line 105b.

As described above, the socket region 235 (e.g., the socket region 335a described with reference to FIG. 3A) includes vias (e.g., the on-pitch via 240) for connecting the word lines 105b with the CMOS circuitry 210. Similarly, the 3D cross-point memory device including the memory array 201 may include another socket region (the socket region 335b described with reference to FIG. 3A) including vias for connecting the bit lines 110 with the CMOS circuitry 210. The vias for connecting the bit lines 110 with the CMOS circuitry 210 may include heights generally corresponding to a vertical distance between the CMOS circuitry 210 and the bit lines 110. Further, the 3D cross-point memory device including the memory array 201 may include yet another socket region including vias for connecting the word lines 105a with the CMOS circuitry 210. The vias for connecting the word lines 105a with the CMOS circuitry 210 may include heights generally corresponding to a vertical distance between the CMOS circuitry 210 and the word lines 105a.

In some embodiments, the on-pitch via 240 may include a straight (continuous, smooth) side wall profile as depict in the diagram 200. In other embodiments, the on-pitch via 240 may include an uneven (discontinuous) side wall profiles—e.g., two or more vias stacked on top of another. In such embodiments, the on-pitch via 240 may be regarded as a series of partially formed vias stacked on top of another, where each partially formed vias is related to a portion of process steps building the cell stacks of the memory array 201.

In some embodiments, the on-pitch via 240 includes a conductive material (e.g., tungsten (W), copper (Cu)). In some embodiments, the top surface of on-pitch via 240 (e.g., W surface) can be exposed to a chemical-mechanical planarization (CMP) process, which includes certain chemistries associated with one or more CMP slurries and/or cleaning solutions. Further, during the CMP process, a local pressure exerted from a polishing pad toward the surface of the on-pitch via 240 may vary based on pattern densities that surround the on-pitch via 240—e.g., whether the on-pitch vias 240 are near to (or far from) the array region with densely populated cell stacks. As such, a topography of the surface of the on-pitch via 240 may vary even if the on-pitch via 240 are designed (e.g., laid out) to be identical. In some embodiments, the surface (e.g., W surface) having a greater area may be more robust against various chemical and/or mechanical interactions when exposed to the chemicals and/or varying local pressure during the CMP process.

Moreover, the top surface of on-pitch via 240 (e.g., the polished W surface) can be connected to the access lines (e.g., the word line 105b) and an interface 245 may form between the top surface of the on-pitch via 240 and the word line 105b. In some embodiments, various characteristics of the interface 245 (e.g., a contact area between the on-pitch via 240 and the access line, recessed/protruded W surface with respect to the access lines) determines an amount of current flowing between the word line 105b (thus, a selected memory cell coupled with the word line 105b) and the CMOS circuitry 210 during access operations (e.g., read operations, write operations).

In some embodiments, the CMOS circuitry 210 may be formed in the substrate 205 such that the memory array 210 can be disposed above the CMOS circuitry 210. The CMOS circuitry 210 may include access line decoders configured to drive (e.g., activate, select) access lines 105 and 110 of the memory array 201 among other circuit blocks for operating the memory device. Thereafter, a first insulative material (e.g., a portion of the insulative material 215) may be formed (e.g., deposited) above the CMOS circuitry 210. The cell stacks 220 of the memory array 210 may be formed on top of the first insulative material, which may include partially forming a plurality of memory cells (e.g., a plurality of cell stacks that each include memory cells 115a and memory cells 115b) in the array region 230 of the memory device The array region 230 includes a border (e.g., the boundary 225) separating the array region 230 from a peripheral region (e.g., the socket region 235). Each of the cell stacks may include a first conductive material covered by a dielectric material, where the first conductive material is devised to connected to corresponding access lines at a later process step. Subsequently, another insulative material (e.g., additional portion of the insulative material 215) may be formed in the peripheral region—e.g., to bring surfaces of the array region 230 and the socket region 235 at an approximately same level.

In some embodiments, a first via (e.g., the on-pitch via 240) and a second via (not shown in FIG. 2) may be formed in the insulative material 215 of the peripheral region. The first via may be separated from the boundary 225 by a first distance (e.g., the distance D) and has a first length perpendicular to the border, and the second via may be separated from the border by a second distance greater than the first distance and has a second length perpendicular to the border, the second length different from the first length (e.g., less than the first length). Subsequently, a first access line and a second access line parallel to the first access line may be formed concurrently, where the first and second access lines are perpendicular to the border. The first access line may connect the first via to the first conductive materials of a first group of memory cells of the plurality (e.g., a first group of cell stacks of the plurality), and the second access line may connect the second via to the first conductive materials of a second group of memory cells of the plurality (e.g., a second group of cell stacks of the plurality).

In some embodiments, the dielectric material on top of the first conductive material of the cell stacks may be removed (e.g., using a CMP process) to expose the first conductive material, during which surfaces of a second conductive material of the first and second vias are exposed as a result of removing the dielectric material. Subsequently, a first access line may be formed such that the exposed surface of the second conductive material of the first via can be connected to the first conductive materials of a first group of memory cells of the plurality (e.g., a first group of cell stacks of the plurality). In addition, a second access line may be formed such that the exposed surface of the second conductive material of the second via can be connected to the first conductive materials of a second group of memory cells of the plurality (e.g., a second group of cell stacks of the plurality).

Figure 3A:
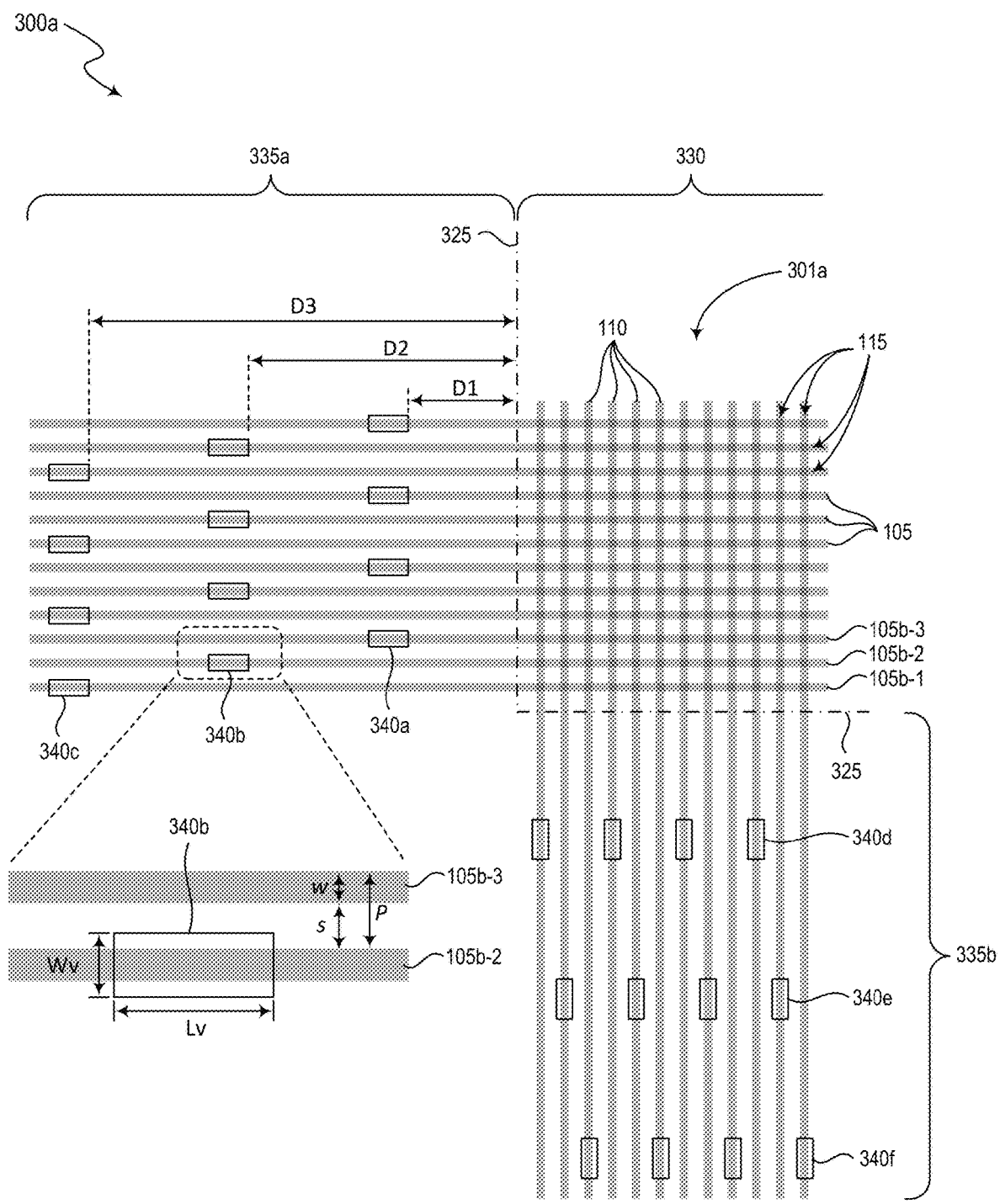
FIGS. 3A-3C are plan-view schematic diagrams of 3-dimensional cross-point memory arrays in accordance with embodiments of the present technology.

FIG. 3A is a plan-view schematic diagram 300a of a 3D cross-point memory array 301a ("memory array") in accordance with embodiments of the present technology. The diagram 300a may be regarded as illustrating a portion of a 3D cross-point memory device including the memory array 301. The diagram 300a includes an array region 330, where the memory array 301a is disposed, socket regions 335 (individually identified as socket regions 335a and 335b), and a boundary 325 of the array region 330 (which may be referred to as a border between the array region 330 and the socket regions 335). The memory array 301 may be an example of or include aspects of the memory array 201 and/or the memory array 101. For example, the memory array 301 includes word lines 105, bit lines 110, and memory cells 115 at cross-points of the individual word lines 105 and bit lines 110.

Further, the diagram 300a includes on-pitch vias 340. For example, an on-pitch via 340a overlays (i.e., connects to) a portion of a word line 105b-3 and spaced apart from the boundary 325 by a distance D1. Similarly, an on-pitch via 340b overlays a portion of a word line 105b-2 and spaced apart from the boundary 325 by a distance D2, which is greater than D1. Further, an on-pitch via 340c overlays a portion of a word line 105b-1 and spaced apart from the boundary 325 by a distance D3, which is greater than D2. As such, the socket region 335a includes on-pitch vias 340 configured to couple with the word lines 105. Similarly, the socket region 335b includes on-pitch vias 340 (e.g., on-pitch vias 340d through 340f) configured to couple with the bit lines 110. Thus, the diagram 300a may be regarded as a portion of a layout of a semiconductor device (e.g., the memory device including the memory array 301) including a corner of the array region 330 and the socket regions 335a and 335b next to the array region 330.

The 3D cross-point memory device may also include CMOS circuitry (e.g., the CMOS circuitry 210, not shown in FIG. 3A) disposed below the array region 330 and/or the socket regions 335 as described with reference to FIG. 2. Individual on-pitch vias 340 may be connected to and extend from the CMOS circuitry (e.g., the access line decoders of the CMOS circuitry). Moreover, top surfaces of the on-pitch vias 340 (e.g., openings of the layout of the on-pitch vias 340) may be configured to couple with access lines at different elevations (i.e., via levels). For example, the top surfaces of the on-pitch vias 340 configured to couple with the bit lines 110 may correspond to a via level n (or the $n^{th}$ via level). Similarly, the top surfaces of the on-pitch vias 340 configured to couple with the word lines 105 (e.g., word lines 105a of the lower deck, word lines 105b of the upper deck) may correspond to a via level n+1 (or the (n+1)th via level), which may be formed subsequently to the via level n (e.g., for word lines 105b of the upper deck), or a via level n−1 (or the $(n-1)^{th}$ via level), which may be formed prior to the via level n (e.g., for word lines 105a of the lower deck). A person skilled in the art will understand the via level n+1 may represent any via level that comes before the via level n, and the via the via level n−1 may represent any via level that comes before the via level n.

In some embodiments, the on-pitch vias 340 include a length longitudinal to the access lines. Further, the on-pitch vias 340 may include a width perpendicular to the length, where the width is equal to or less than a pitch of the access lines. For example, the diagram 300a includes an enlarged portion of the socket region 335a including the on-pitch via 340b. As described above, the on-pitch via 340b overlays (i.e., connects to) the word line 105b-2. The on-pitch via 340b can be designed (e.g., drawn or laid out) to have a length Lv that is longitudinal to the word line 105b-2. Further, the on-pitch via 340b can be designed to have a width Wv perpendicular to the length Lv. In some embodiments, the width Wv may be equal to the pitch P of the word lines 105b, i.e., a width (w) of the word line 105b-2 and a space (s) between the word lines (e.g., the word line 105b-3 and the word line 105b-2). In other embodiments, the width Wv may be less than the pitch P of the word lines 105b. When the width Wv is greater than the pitch P, the on-pitch via 340b may be connected to other word lines (e.g., the word line 105b-1 and/or the word line 105b-3) under certain process conditions and cause undesired electrical shorts between the word lines. The on-pitch vias 340 depicted in the diagram 300a are drawn to have a common length L and a common width W—i.e., dimensions of the on-pitch vias 340 in the diagram 300a are identical.

As described with reference to FIG. 2, various interactions between the on-pitch vias 340 and processing conditions (e.g., distances to the array region 330, effects of slurry and cleaning solutions chemistry) may result in different physical and electrical characteristics of the on-pitch vias 340. In some embodiments, heights of vias (e.g., the on-pitch via 340) may vary based on their distance D from the boundary 325, after the CMP process—e.g., due to a variation in a local pressure. For example, a CMP process may be targeted (e.g., optimized) to generate the on-pitch via 340b with a desired height H—e.g., the height of via minimizing the undulation that an access line may experience as described with reference to FIG. 2. Then, the on-pitch via 340*a* (the nearest via among the on-pitch vias 340*a-c*) may have a first height (measured from the underlying CMOS circuitry) that is less than the height (H) of the on-pitch via 340*b*. Further, the on-pitch via 340*c* (the farthest via among the on-pitch vias 340*a-c*) may have a third height that is greater than the second height (H) of the on-pitch via 340*b*. As such, if the process conditions (e.g., the CMP process conditions including one or more slurries, grinding pads, pressure, rotation speeds, etc.) are targeted to generate the desired height (H) for the on-pitch via 340*b*, the on-pitch via 340*a* may be recessed while the on-pitch via 340*c* is protruded, with reference to the height (H) of the on-pitch via 340*b*, respectively. When a via is either protruded or recessed, the access lines connected thereto may experience undulation (either up or down), which may decrease an amount of current flowing through the recessed (or protruded) vias.

In some cases, the interfacial characteristics of the on-pitch vias 340 may be affected due to their distances to the array region 330. For example, the surface topography and/or interfacial characteristics of the on-pitch via 340*a* (e.g., the nearest on-pitch via to the array region 330) may be degraded when compared to those of the on-pitch via 340*c* (e.g., the farthest on-pitch via to the array region 330), which in turn, may result in an amount of current flowing through the on-pitch via 340*a* to be less than that flowing through the on-pitch via 340*c*. For example, a first current flowing through the on-pitch via 340*a* may be less than a third current flowing through the on-pitch via 340*c* by approximately 10%. In some cases, the surface of the on-pitch vias 340 may suffer chemical and/or mechanical attacks during CMP process degrading overall quality of the surface of the on-pitch vias 340. Such variations (e.g., the height variation, the surface quality variations, or both) may be detrimental to maintain (or control) the electrical characteristics of the memory cell in the memory array 301—e.g., minimizing variations among the memory cells within the memory array 301.

Figure 3B:
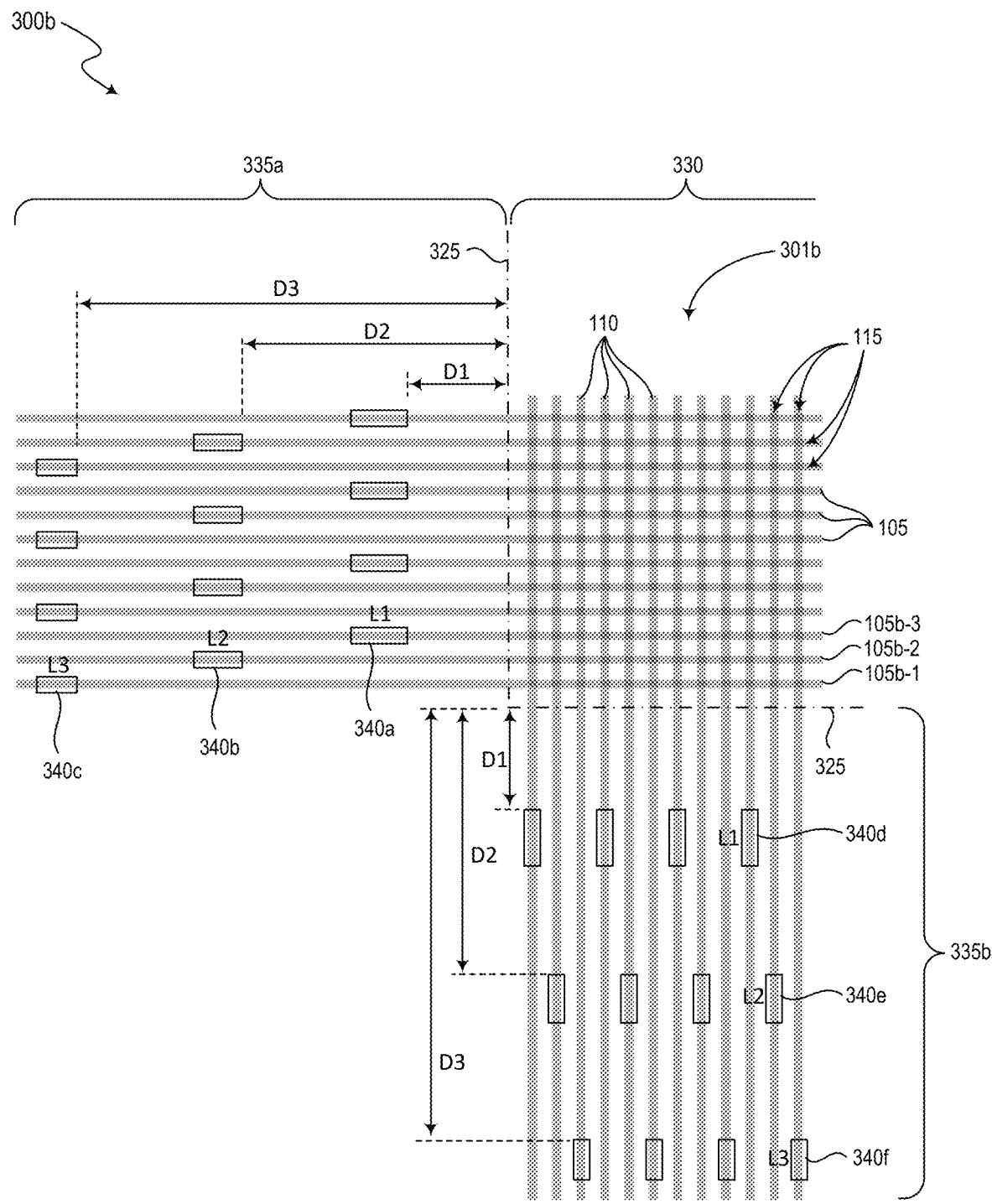

FIG. 3B is a plan-view schematic diagram 300*b* including a 3D cross-point memory array 301*b* ("memory array") in accordance with embodiments of the present technology. The diagram 300*b* may be regarded as illustrating a portion of a 3D cross-point memory device including the memory array 301*b*. The diagram 300*b* may be regarded the same as the diagram 300*a* except that the on-pitch vias 340 in the diagram 300*b* include different dimensions (e.g., lengths longitudinal to the access lines) based on their proximity to the array region—e.g., distances from the array boundary 325. For example, the on-pitch via 340*a* has a length L1 longitudinal to the word line 105*b*-3. The on-pitch via 340*b* has a length L2 longitudinal to the word line 105*b*-2, which is less than L1. Further, the on-pitch via 340*c* has a length L3 longitudinal to the word line 105*b*-1, which is less than L2. Widths of all the on-pitch vias 340 may be maintained the same (e.g., same as or less than the pitch P of the word lines 105*b*). In this manner, the on-pitch via 340*a* (e.g., the nearest on-pitch via to the array region 330) has a greater surface area than other on-pitch vias (e.g., the on-pitch via 340*b*, the on-pitch via 340*c*) when the CMP process exposes the surface of on-pitch vias 340.

As described above, the greater surface area may make the surface of the on-pitch vias 340 more robust against chemical and/or mechanical interactions (e.g., attacks) during the CMP process. In this manner, the variable surface areas of the on-pitch vias 340 based on the distances from the array boundary 325 may facilitate to reduce variations (or otherwise compensate) in the physical and/or electrical characteristics of the interface. For example, the height differences between the on-pitch via 340*a* and the on-pitch via 340*b* (or the on-pitch via 340*c*) may be reduced, at least partially due to the improved robustness of the on-pitch via 340*a* stemming from the greater surface area (e.g., L1 is greater than L2 or L3). Additionally, or alternatively, the surface topography and/or interfacial characteristics the on-pitch via 340*a* may be improved at least partially owing to the greater surface area. Further, the greater surface area of the on-pitch via 340*a* is expected to reduce the interface resistance against the current flowing therethrough, which in turn, helps to reduce differences in amounts of current in other on-pitch vias (e.g., on-pitch via 340*c*).

As such, when the CMP process is targeted to generate a desired height and surface and/or interface characteristics of the on-pitch via 340*b*, deviations in the above described interface characteristics of the on-pitch via 340*a* (and/or the on-pitch via 340*c*) may be reduced. Similarly, the on-pitch vias 340 in the socket area 335*b* (e.g., the on-pitch vias 340*d-f* configured to couple with the bit lines 110) can be modified based on their distances from the array boundary 325 such that the variations in the physical and/or electrical characteristics may be reduced. Thus, the memory array 301*b*, in comparison to the memory array 301*a*, may maintain a more uniform distribution of current (e.g., access current) throughout the memory array, which in turn, may reduce variations in various memory cell characteristics, such as programming and/or read current distributions, cycling behaviors, data retention characteristics, among others.

Figure 3C:
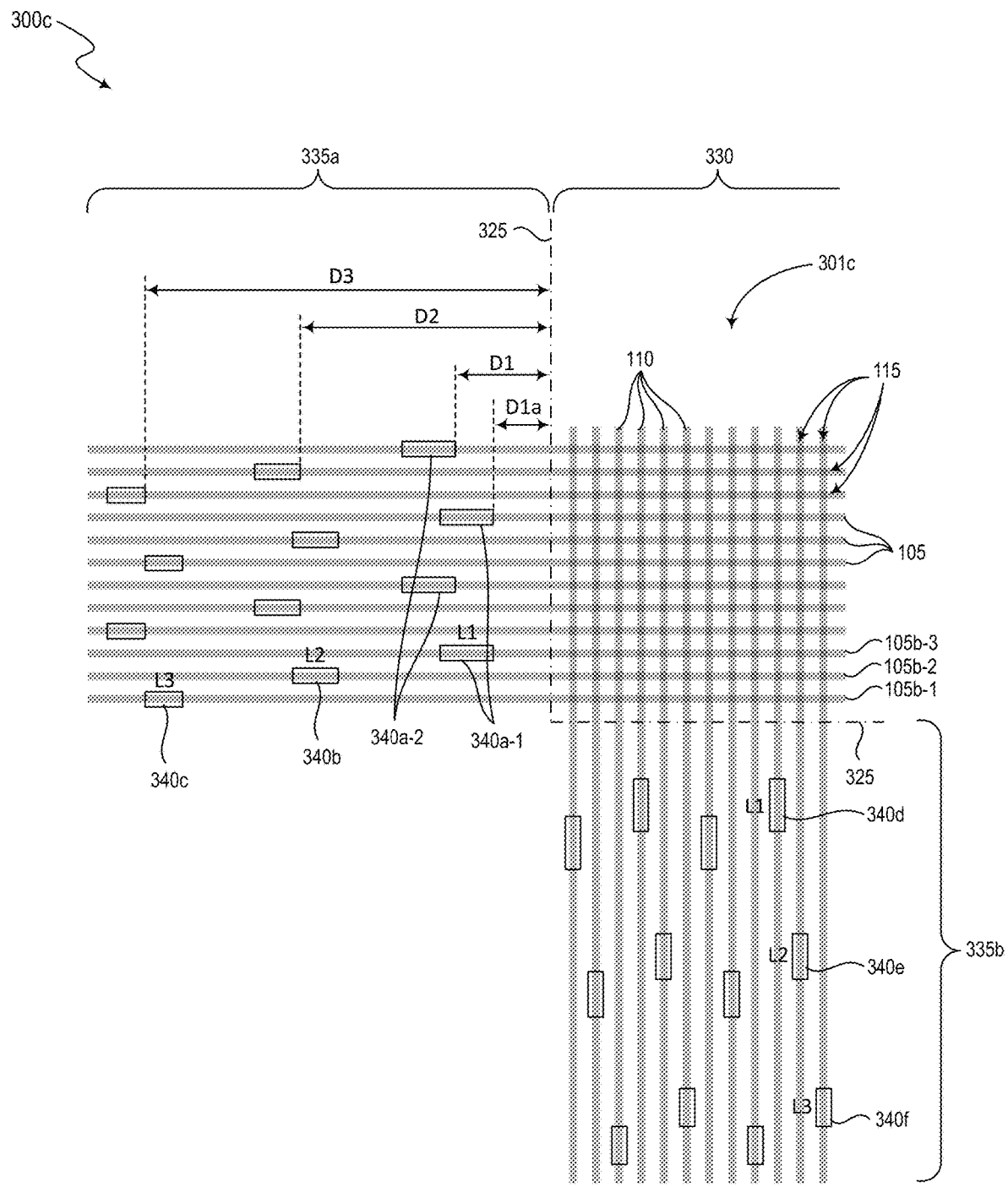

FIG. 3C is a plan-view schematic diagram 300*c* including a 3D cross-point memory array 301*c* ("memory array") in accordance with embodiments of the present technology. The diagram 300*c* may be regarded as illustrating a portion of a 3D cross-point memory device including the memory array 301*c*. The diagram 300*c* may be regarded the same as the diagram 300*b* except that some of the on-pitch vias 340 are staggered from other on-pitch vias 340. For example, the on-pitch vias 340*a*-1 and 340*a*-2 are offset from each other (e.g., staggered) such that a distance between center points of the on-pitch vias 340*a*-1 and 340*a*-2 is increased when compared to two on-pitch vias 340 located without such an offset (e.g., in FIG. 3A or FIG. 3B).

As a result of the staggering, the on-pitch via 340*a*-1 may be disposed at a location away from the boundary 325 by a distance D1*a* that is less than the distance D1 of the on-pitch via 340*a*-2. Further, individual access lines coupled with the on-pitch vias 340*a*-1 alternate with individual access lines coupled with the on-pitch vias 340*a*-2. In some cases, the increased distance between the on-pitch vias 340*a*-1 and 340*a*-2 may provide a wider process latitude (process window) for patterning the on-pitch vias 340—e.g., improving integrity of the shape of on-pitch vias 340. Thus, the memory array 301*c*, in comparison to the memory array 301*b* (and/or the memory array 301*a*), may be less prone to various issues related to the shape of on-pitch vias 340, such as closed vias, bridging between vias, or the like.

Figure 4:
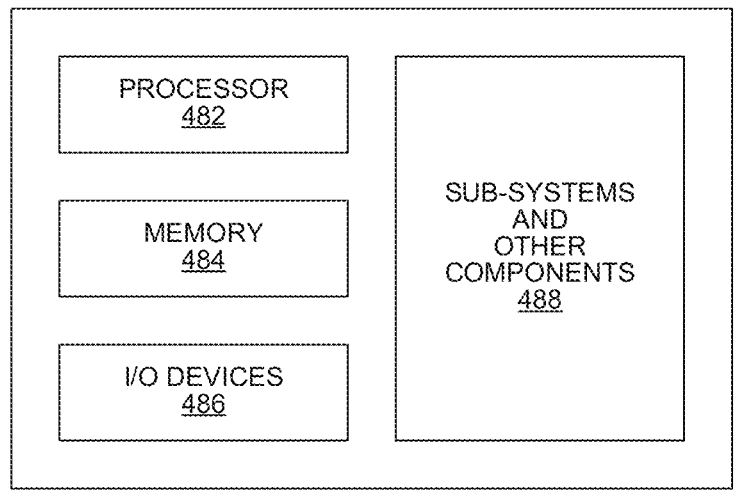
FIG. 4 is a schematic view of a system that includes a memory device including on-pitch vias in accordance with embodiments of the present technology.

The memory device described in detail above with reference to FIGS. 1 through 3C or packages incorporating such a memory device can be incorporated into any of a myriad of larger and/or more complex systems, a representative example of which is a system 480 shown schematically in FIG. 4. The system 480 can include a processor 482, a memory 484 (e.g., SRAM, DRAM, flash, 3D cross-point and/or other memory devices), input/output devices 486, and/or other subsystems or components 488. For example, the memory 484 may include 3D cross-point memory devices with memory arrays described with reference to FIG. 1 through 3 (e.g., the memory arrays 101, 201, and/or 301). As such, the memory devices of the memory 484 can include on-pitch vias with their sizes different from each other based on their relative locations from the memory arrays. The memory devices and/or packages incorporating such memory devices can be included in any of the elements shown in FIG. 4.

The resulting system 480 can be configured to perform any of a wide variety of suitable computing, processing, storage, sensing, imaging, and/or other functions. Accordingly, representative examples of the system 480 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 480 include lights, cameras, vehicles, etc. With regard to these and other example, the system 480 can be housed in a single unit or distributed over multiple interconnected units, for example, through a communication network. The components of the system 480 can accordingly include local and/or remote memory storage devices and any of a wide variety of suitable computer-readable media.

FIG. 5 is a flowchart 500 of a method for making a memory device including on-pitch vias in accordance with embodiments of the present technology. The flowchart 500 may include aspects of methods as described with reference to FIGS. 1 through 3C.

The method includes partially forming a plurality of memory cells in an array region of the memory device, the array region including a border separating the array region from a peripheral region, where each of the memory cells includes a first conductive material (box 510). The method further includes forming a first via and a second via in an insulative material of the peripheral region, where the first via is separated from the border by a first distance and has a first length perpendicular to the border, and where the second via is separated from the border by a second distance greater than the first distance and has a second length perpendicular to the border, the second length less than the first length (box 515).

In some embodiments, the method may further include concurrently forming a first access line and a second access line parallel to the first access line, the first and second access lines perpendicular to the border, where the first access line connects the first via to the first conductive materials of a first group of memory cells of the plurality, and the second access line connects the second via to the first conductive materials of a second group of memory cells of the plurality. In some embodiments, the method may further include removing a dielectric material on top of the first conductive material of the memory cells, where a surface of a second conductive material of the first and second vias is exposed as a result of removing the dielectric material. In some embodiments, the method may further include forming a first access line connecting the exposed surface of the second conductive material of the first via to the first conductive materials of a first group of memory cells of the plurality, and forming a second access line connecting the exposed surface of the second conductive material of the second via to the first conductive materials of a second group of memory cells of the plurality.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

Although in foregoing example embodiments, memory devices provided with 3D cross-point memory arrays coupled with CMOS circuitry through on-pitch vias have been described and illustrated, in other embodiments, memory devices may be provided with different types of memory arrays—e.g., DRAM, 3D NAND flash memory, resistive memory, magnetic memory, ferroelectric memory, etc. Moreover, the present technology of modifying shapes (design, layout) of vias may be applied to semiconductor devices other than memory devices to mitigate systematic process variability (e.g., the proximity effect) that challenges forming tightly-packed features (e.g., on-pitch vias) during the manufacturing process. Additionally, although in the foregoing example embodiments, the near on-pitch vias (e.g., on-pitch vias disposed near to the memory array) have been illustrated and described to have greater surface area than the far on-pitch vias (e.g., on-pitch vias disposed far from the memory array), the present technology is not limited thereto. For example, in some embodiments, the far on-pitch vias may include greater surface areas than the near on-pitch vias—e.g., if the CMP process step affecting the on-pitch vias has different (e.g., opposite) trends, due to different slurries, cleaning solutions, pads, etc.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device, comprising:
a first trace laterally extending away from a feature;
a second trace extending parallel to the first trace and laterally away from the feature;
a first via coupled with the first trace, the first via separated from the feature by a first lateral distance and having a first length measured parallel to the first trace; and
a second via coupled with the second trace, the second via separated from the feature by a second lateral distance greater than the first lateral distance and having a second length measured parallel to the second trace, the second length less than the first length.

2. The semiconductor device of claim 1, wherein the first and second vias include a same width perpendicular to the first and second lengths, the width equal to or less than a pitch of the traces.

3. The semiconductor device of claim 1, wherein:
the first via includes a first height; and
the second via includes a second height greater than the first height.

4. The semiconductor device of claim 1, wherein the first and second vias include a first conductive material having a surface that has been polished.

5. The semiconductor device of claim 4, wherein the first and second traces include a second conductive material formed in contact with the polished surface of the first conductive material of the first and second vias, respectively.

6. The semiconductor device of claim 1, wherein the feature is a boundary of a memory array.

7. A semiconductor device, comprising:
a first region including a plurality of first traces and a plurality of second traces, the first and second traces extending laterally and perpendicular to each other; and
a second region adjacent to a side of the first region, the second region including a plurality of first vias and a plurality of second vias, wherein the first traces extend from the first region into the second region, and wherein:
each of the first vias is coupled with a corresponding one of the first traces, the first vias located away from the side by a first lateral distance and having a first length measured parallel to the first traces; and
each of the second vias is coupled with a corresponding one of the first traces, the second vias located away from the side by a second lateral distance greater than the first lateral distance and having a second length measured parallel to the first traces, the second length less than the first length.

8. The semiconductor device of claim 7, wherein the first and second vias include a same width perpendicular to the first and second lengths, the width equal to or less than a pitch of the first trace.

9. The semiconductor device of claim 7, wherein the side is a first side of the first region, and wherein the semiconductor device further comprises:
a third region adjacent to a second side of the first region perpendicular to the first side, the third region including a plurality of third vias and a plurality of fourth vias, wherein the second traces extend from the first region into the third region.

10. The semiconductor device of claim 9, wherein:
each of the third vias is coupled with a corresponding one of the second traces, the third vias located away from the second side by a third distance and including a third length longitudinal to the second traces; and
each of the fourth vias is coupled with a corresponding one of the second traces, the fourth vias located away from the second side by a fourth distance greater than the third distance and including a fourth length longitudinal to the second traces, the fourth length less than the third length.

11. The semiconductor device of claim 10, wherein:
the first length is equal to the third length;
the second length is equal to the fourth length;
the first distance is equal to the third distance; and
the second distance is equal to the fourth distance.

12. The semiconductor device of claim 7, wherein the second region further includes a plurality of third vias, each of the third vias being coupled with a corresponding one of the first traces, the third vias located away from the side by a third distance less than the first distance, each of the third vias having the first length longitudinal to the first traces, wherein individual first traces coupled with the vias of the first plurality alternate with individual first traces coupled with the vias of the third plurality.

13. The semiconductor device of claim 7, wherein the plurality of first traces are parallel to one another, and wherein the plurality of second traces are parallel to one another.

* * * * *